(12) United States Patent
Suda et al.

(10) Patent No.: US 8,476,641 B2
(45) Date of Patent: Jul. 2, 2013

(54) SEMICONDUCTOR MEMORY DEVICE

(75) Inventors: Yoshiyuki Suda, Koganei (JP); Yutaka Ota, Ota (JP)

(73) Assignee: National University Corporation Tokyo University of Agriculture and Technology, Fuchu-shi (JP)

( * ) Notice: Subject to any disclaimer, the term of this patent is extended or adjusted under 35 U.S.C. 154(b) by 412 days.

(21) Appl. No.: 12/745,133

(22) PCT Filed: Sep. 8, 2008

(86) PCT No.: PCT/JP2008/066500
§ 371 (c)(1),
(2), (4) Date: May 27, 2010

(87) PCT Pub. No.: WO2009/069365
PCT Pub. Date: Jun. 4, 2009

(65) Prior Publication Data
US 2010/0308341 A1      Dec. 9, 2010

(30) Foreign Application Priority Data
Nov. 30, 2007   (JP) ................................. 2007-310662

(51) Int. Cl.
*H01L 29/24*   (2006.01)
(52) U.S. Cl.
USPC ............... 257/77; 257/4; 257/5; 257/E29.104
(58) Field of Classification Search
USPC ....... 257/1, 2, 4, 5, 76, 77, 565–593, E29.104
See application file for complete search history.

(56) References Cited

U.S. PATENT DOCUMENTS 4,180,866 A * 12/1979 Shanks .......................... 365/186
6,077,760 A *  6/2000 Fang et al. ..................... 438/492

(Continued)

FOREIGN PATENT DOCUMENTS

EP      1 418 620      5/2004
JP      6-275791       9/1994

(Continued)

OTHER PUBLICATIONS

Suda et al., U.S. Office Action mailed Feb. 11, 2011, directed to U.S. Appl. No. 12/745,146; 8 pages.

(Continued)

*Primary Examiner* — Robert J Hoffberg
*Assistant Examiner* — Eric Ward
(74) *Attorney, Agent, or Firm* — Morrison & Foerster LLP

(57) ABSTRACT

A switching resistance RAM that is highly integrated as well as reduced in a read-out time is realized. There is formed an NPN type bipolar transistor BT composed of a collector layer made of an N-well 11, a base layer made of a P+ type Si layer 12A formed in a surface of the N-well 11, and an emitter layer made of an N+ type Si layer 15 formed in a surface of the P+ type Si layer 12A. Also, there are formed a word line WL0 electrically connected to the N+ type Si layer 15 and bit lines BL1-BL4 intersecting with the word line WL0. Also, there are formed a plurality of switching layers 14 formed on a surface of the P+ type Si layer 12A, each being electrically connected to corresponding each of the bit lines and switching between an ON state and an OFF state and an electric potential fixing line 19A to fix the P+ type Si layer 12A at a predetermined electric potential.

3 Claims, 12 Drawing Sheets

U.S. PATENT DOCUMENTS

| | | | |
|---|---|---|---|
| 6,169,688 B1 | 1/2001 | Noguchi | |
| 6,271,544 B1 * | 8/2001 | Fang et al. | 257/77 |
| 6,573,586 B2 | 6/2003 | Sakata et al. | |
| 6,597,031 B2 * | 7/2003 | Kuge | 257/295 |
| 6,946,702 B2 * | 9/2005 | Jang | 257/306 |
| 6,989,580 B2 * | 1/2006 | Pellizzer et al. | 257/577 |
| 7,053,431 B2 * | 5/2006 | Ogiwara | 257/295 |
| 7,208,751 B2 * | 4/2007 | Ooishi | 257/5 |
| 7,362,609 B2 | 4/2008 | Harrison et al. | |
| 7,569,846 B2 | 8/2009 | Choi et al. | |
| 2003/0155569 A1 | 8/2003 | Lee | |
| 2004/0090822 A1 | 5/2004 | Yoo et al. | |
| 2008/0054270 A1 * | 3/2008 | Suda | 257/77 |
| 2010/0301301 A1 | 12/2010 | Suda et al. | |

FOREIGN PATENT DOCUMENTS

| | | |
|---|---|---|
| JP | 11-345485 | 12/1999 |
| JP | 2002-367365 | 12/2002 |
| JP | 2004-158863 | 6/2004 |
| JP | 2005-538552 | 12/2005 |
| JP | 2006-313912 | 11/2006 |

OTHER PUBLICATIONS

International Search Report mailed Dec. 16, 2008 directed to International Patent Application No. PCT/JP2008/066499; 2 pages.

International Search Report mailed Dec. 16, 2008, directed to International Patent Application No. PCT/JP2008/066500; 4 pages.

Takada, K. et al. (1999). "Memory Function of a SiO2/β-SiC//Si MIS Diode." *Extended Abstracts of the 1999 International Conference on Solid State Devices and Materials.* 132-133.

Hosoi, Y. et al. (2006). "High speed Unipolar Switching Resistance RAM (RRAM) Technology." IEDM 2006 30-7 (IEEE). 4 pages.

* cited by examiner

US 8,476,641 B2

SEMICONDUCTOR MEMORY DEVICE

REFERENCE TO RELATED APPLICATIONS

This application is a national stage application under 35 USC 371 of International Application No. PCT/JP2008/066500, filed Sep. 8, 2008, which claims priority from Japanese Patent Application No. 2007-310662, filed Nov. 30, 2007, the contents of which prior applications are incorporated herein by reference.

FIELD OF THE INVENTION

This invention relates to a semiconductor memory device using a two-terminal memory cell that is made of a Si layer, a SiC layer and a Si oxide layer.

BACKGROUND OF THE INVENTION

In recent years, the semiconductor memory device is used as a memory device to store information in various fields. A flash memory, a RAM, a ROM and the like are used as conventional semiconductor memory devices. They are three-terminal memories that require three control electrodes. In recent years, as an amount of stored information is required to increase, a two-terminal memory that can be controlled with two electrodes is expected to appear. The two-terminal memory takes less occupied area per one unit of memory on a circuit board since it has reduced number of electrodes compared with the three-terminal memory. Therefore, the number of memories per unit area of the circuit board can be increased, and the amount of information per area, that is, a density of the stored information can be expanded. Therefore, a memory device capable of handling a larger amount of information can be manufactured with a board of a small area.

In recent years, a switching resistance RAM is studied as the two-terminal memory. The switching resistance RAM has a structure in which a memory cell formed using a switching layer that switches between an ON state and an OFF state by applying an electric potential is connected at an intersection of a bit line and a word line. The switching layer can be regarded as a resistive element in terms of an equivalent circuit, and has a property that its resistance is reduced in the ON state and increased in the OFF state. Writing-in, reading-out and erasing of data can be made by controlling electric potentials applied to the bit line and the word line.

FIG. 16 shows the structure of the switching resistance RAM as described above. Each of memory cells CEL1-CEL4 that include the switching layer is connected at each of intersections of word lines WL0 and WL1 and bit lines BL0 and BL1, respectively.

Now, suppose the memory cell CEL1 is selected. At that time, the bit line BL1 and the word line WL0 are selected, and their electric potentials are set to an H level and an L level respectively. An electric potential of the unselected bit line BL0 is set to the L level, and an electric potential of the unselected word line WL1 is set to the H level. Thus, an electric current flowing through the selected memory cell CEL1 can be sensed when a current sense amplifier is connected to the bit line BL1. That is, since the electric current is large when the memory cell CEL1 is set to the ON state and small when it is set to the OFF state, the data ("1" or "0") stored in the memory cell CEL1 can be read-out based on a result of sensing by the current sense amplifier.

Y. Hosoi et al. "High speed Unipolar Switching Resistance RRAM (RRAM) Technology" IEDM 2006 30-7 and K. Takada, M. Fukumoto, Y. Suda, "Memory Function of a $SiO_2$/β-SiC/Si MIS Diode" Ext. Abs. 1999 International Conference on Solid State and Materials, p. 132-133 (1999) are named as examples of related technical documents.

SUMMARY OF THE INVENTION

There are problems in the switching resistance RAM described above. First, there is a problem that a read-out time becomes long since the read-out current flowing through the switching layer is small.

Second, there is a problem that an unnecessary sneak current flowing through the unselected word line occurs during reading-out, and current consumption becomes very large. The sneak current is explained hereafter, referring to FIG. 16.

Now, suppose the memory cells CEL3 and CEL4 are set to the ON state. Then, the sneak current flows from the unselected word line WL1 to the selected word line WL0 through the memory cells CEL3 and CEL4. The sneak current is not shown in the drawing. Since it occurs from the other unselected word lines as well, the consumption current becomes very large. In addition, when the sneak current flows into the selected word line WL0, the electric potential of the word line WL0 is raised to cause another problem that the current flowing through the selected memory cell CEL1 is reduced.

Here, the unselected memory cell CEL3 is biased inversely to the selected memory cell CEL1. The sneak current occurs since the current flows through the unselected memory cell CEL3 that is inversely biased. Thus, it is conceived that each of diodes D1-D4 is connected in series with the switching layer in each of the memory cells CEL1-CEL4 as shown in FIG. 17, so that the sneak current is prevented from occurring.

However, there is a problem that the number of elements to form the memory cell is increased and the occupied area is increase. Also, while turning the memory cells CL1-CL4 from the ON state to the OFF state requires feeding a reverse current through a switching layer in a direction opposite to the direction of current during the reading-out, that is, in a direction from the word line to the bit line, it is not possible to feed the reverse current when the diodes D1-D4 are provided as described above. Although this problem can be solved by providing reset electrodes R1 and R0 as shown in FIG. 18 so that the reverse current is fed through the switching layer bypassing the diodes D1-D4, it is inevitable that the number of elements further increases to increase the occupied area.

A semiconductor memory device of this invention is made in consideration of the issues described above, and is characterized by being provided with a collector layer, a base layer formed in a surface of the collector layer, an emitter layer formed in a surface of the base layer, a word line connected to the emitter layer, a plurality of bit lines extending over the base layer and intersecting with the word line, a plurality of switching layers formed on a surface of the base layer and switching between an ON state and an OFF state, each of the switching layers being electrically connected to corresponding each of the bit lines respectively, and an electric potential fixing line to fix the base layer at a predetermined electric potential.

With the structure described above, since a read-out current flowing from the bit line to the base layer through the switching layer is amplified by a bipolar transistor composed of the collector layer, the base layer and the emitter layer and outputted to the word line, a read-out time can be reduced by sensing it.

In addition to the structure described above, the semiconductor memory device is characterized by that the base layer is made of a Si layer and the switching layer is made of a SiC layer stacked on the Si layer and a Si oxide layer stacked on the SiC layer and connected to the corresponding bit line.

With the structure described above, a reverse current that flows when the switching layer is reverse biased can be reduced to as small as a reverse leakage current of a diode. This is because the switching layer has a function of a diode. Also, applying a reverse electric potential to the switching layer is enough to turn the switching layer from the ON state to the OFF state, and there is no need to feed a large reverse current. Therefore, since there is no need to provide the diodes and the reset electrodes in addition to the switching layers as in the conventional art, the occupied area of the memory cell can be made very small, thus a highly integrated switching resistance RAM can be realized as a result.

With the semiconductor memory device of this invention, the highly integrated switching resistance RAM can be realized while the read-out time is reduced.

DETAILED DESCRIPTION OF THE INVENTION

Figure 1:
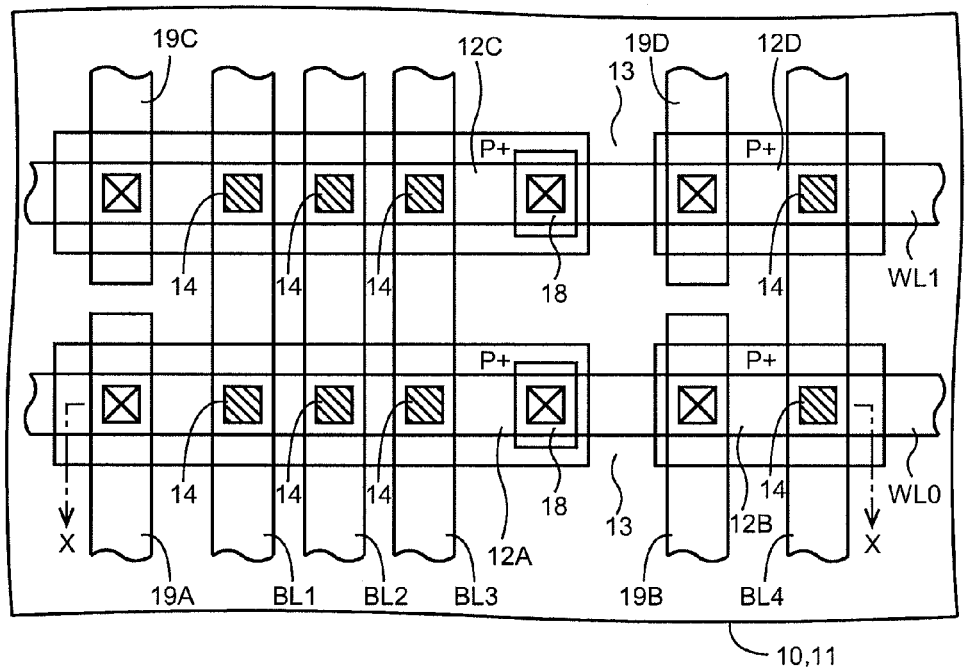
FIG. 1 is a plan view of a semiconductor memory device according to an embodiment of this invention.
Figure 2:
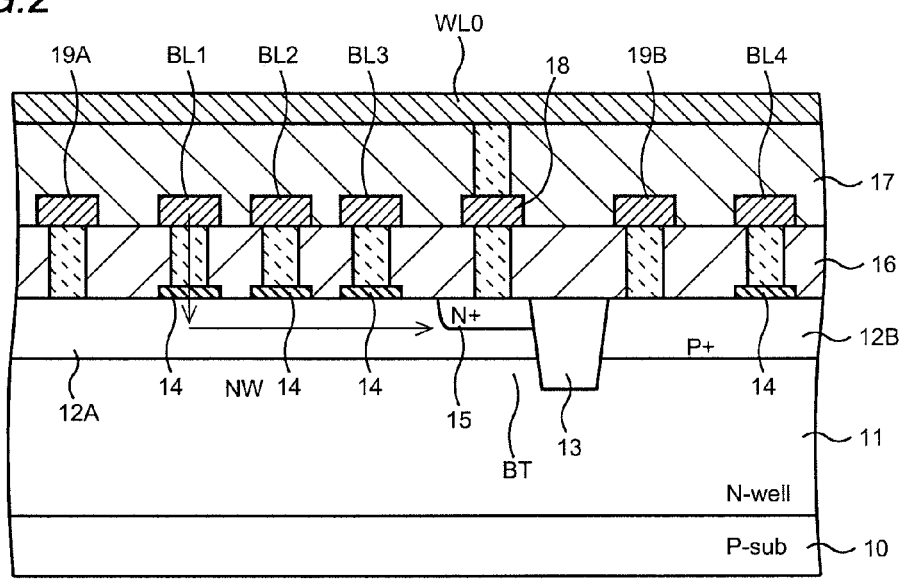
FIG. 2 is a cross-sectional view of a section X-X shown in FIG. 1.

A structure of a semiconductor memory device according to an embodiment of this invention is explained referring to the drawings. FIG. 1 is a plan view of the semiconductor memory device. FIG. 2 is a cross-sectional view showing a section X-X in FIG. 1.

An N-well 11 is formed in a surface of a P type Si (silicon) substrate 10 by diffusing N type impurities. The N well 11 is used as a collector layer. Island-shaped P+ type Si layers 12A, 12B, 12C and 12D are formed in a surface of the N-well 11 by diffusing P type impurities in addition. The P+ type Si layers 12A, 12B, 12C and 12D are used as base layers. The P+ type Si layers 12A, 12B, 12C and 12D are isolated from each other by an element isolation insulating film 13. Although the element isolation insulating film 13 is preferably a Si oxide layer buried in a trench to implement finer design rules, it may be a so-called LOCOS (Local Oxidation of Silicon) oxide film.

Figure 3:
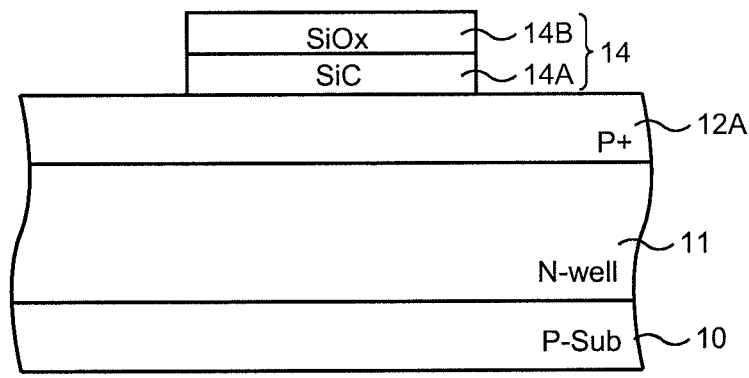
FIG. 3 is a cross-sectional view showing a structure of a switching layer.

And a switching layer 14 that switches between an ON state and an OFF state is formed on a surface of each of the P+ type Si layers 12A, 12B, 12C and 12D. The switching layer 14 is composed of a SiC (silicon carbide) layer 14A stacked on the surface of the P+ type Si layer 12A and a Si oxide layer 14B stacked on the SiC layer 14A, as shown in FIG. 3. The switching layer 14 on each of the P+ type Si layers 12B, 12C and 12D is composed in the same way as described above. The switching layers 14 are disposed corresponding to intersections of bit lines BL1-BL4 and word lines WL0 and WL1. That is, a memory cell is formed at each of the intersections of the bit lines BL1-BL4 and the word lines WL0 and WL1.

Although three memory cells are formed in each of the P+ type Si layers in FIG. 1 and FIG. 2, the number of memory cells may be increased so long as a parasitic capacitance does not increase a read-out time.

And an N+ type Si layer 15 used as an emitter layer is formed in a surface of an end portion of each of the P+ type Si layers 12A and 12C. It is noted that although three switching layers 14 are formed in each of the P+ type Si layers 12A, 12B, 12C and 12D, only one switching layer 14 is shown in each of the P+ type Si layers 12B and 12D in FIG. 1 and FIG. 2 for the sake of convenience.

A first interlayer insulating film 16 is formed over the P type Si substrate 10 in which the switching layers 14 and the N+ type Si layers 15 have been formed. Contact holes are formed in the first interlayer insulating film 16 corresponding to the switching layers 14 and the N+ type Si layer 15. And the Si oxide layer 14B of the switching layer 14 is electrically connected to corresponding each of the bit lines BL1-BL4 through an electrode buried in each of the contact holes, and the N+ type Si layer 15 is electrically connected to an emitter electrode 18. Also, a contact hole is formed in the first interlayer insulating film 16 on each of the P+ type Si layers 12A, 12B, 12C and 12D. And each of the P+ type Si layers 12A, 12B, 12C and 12D (base layers) is electrically connected to each of electric potential fixing lines 19A, 19B, 19C and 19D to fix an electric potential through an electrode buried in each of the contact holes, respectively.

And a second interlayer insulating film 17 is formed on the first interlayer insulting film 16. Contact holes each corresponding to each of the emitter electrodes 18 are formed in the second interlayer insulting film 17, and each of the emitter electrodes 18 is electrically connected to corresponding each of the word lines WL0 and WL1 through an electrode buried in each of the contact holes.

And each of the word lines WL0 and WL1 is provided with each of sense amplifiers to sense a read-out current, which is not shown in the drawings. And the bit lines BL1-BL4, the word lines WL0 and WL1 and the electric potential fixing lines 19A, 19B, 19C and 19D are provided with electric potential applying means to apply electric potentials corresponding to writing-in, reading-out and erasing, which are not shown in the drawings.

According to the embodiment, each of memory units having the same structure as each other is formed on each of the island-shaped P+ type Si layers 12A, 12B, 12C and 12D, as described above. Three memory cells in one of the memory units are disposed at intersections of the word line and the bit lines as the switching layers 14. Therefore, a switching resistance RAM having arbitrary memory capacity can be formed by arraying the memory units described above. And during reading-out, the read-out current flows through the switching layer 14 by applying a positive electric potential to the bit line BL1, for example. The read-out current is small even when the switching layer 14 is in the ON state, since it is basically a tunneling current.

The read-out current flows from the P+ type Si layer 12A (base layer) into the N+ type Si layer 15 (emitter layer) as a base current. Then, an NPN type bipolar transistor BT, that is composed of a collector layer made of the N-well 11, a base layer made of the P+ type Si layer 12A and an emitter layer made of the N+ type Si layer 15, is turned on. It is assumed that the N-well 11 is set to the H level and the word line WL0 is set to the L level. And the read-out current is amplified by the bipolar transistor BT, and the amplified read-out current flows to the word line WL0. Because the sense amplifier is connected to the word line WL0, information stored in the memory cell can be read out in a short period of time by sensing the amplified read-out current with the sense amplifier.

Figure 4:
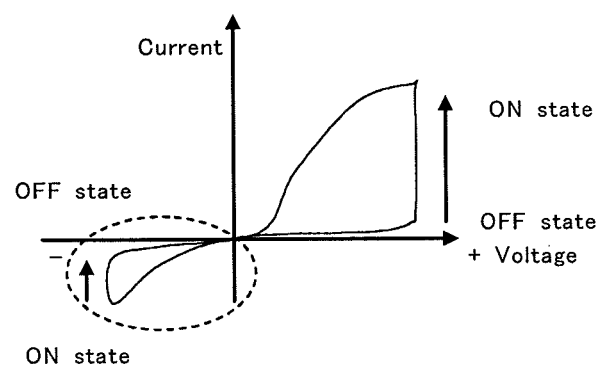
FIG. 4 shows electric characteristics of the switching layer.

Brief explanation on electric characteristics of the switching layer 14 is given here referring to FIG. 4, while various characteristics and a manufacturing method of it will be explained later in detail. FIG. 4 shows a correlation between a voltage applied to the switching layer 14 and a current flowing through the switching layer 14. It is assumed that a voltage applied to the switching layer 14 when the current flows from the bit line over the switching layer 14 to the P+ type Si layer 12A is a positive voltage, that is, a forward voltage, and that a voltage applied to the switching layer 14 when the current inversely flows from the P+ type Si layer 12A to the bit line is a negative voltage, that is, a reverse voltage. In practice, the voltage applied to the switching layer 14 is generated by controlling the electric potentials applied to the bit lines, the word lines and the electric potential fixing lines.

When the switching layer 14 is in the OFF state (erased state), it is in a high resistance state and the current is very small even when the positive voltage is applied. When the positive voltage is further increased, a transition from the OFF state to the ON state (written-in state) takes place and the switching layer 14 turns to a low resistance state, so that a larger current compared with that in the OFF state flows when the positive voltage is applied.

And a reverse current flows when the negative voltage is applied in the ON state. And when the negative voltage is increased, a transition from the ON state to the OFF state takes place, the switching layer 14 resumes to the high resistance state, and almost no reverse current flows.

During reading-out, a positive voltage not high enough to cause the transition from the OFF state to the ON state may be applied, and the read-out current flowing through the switching layer 14 is amplified and sensed as described above.

Figure 17:
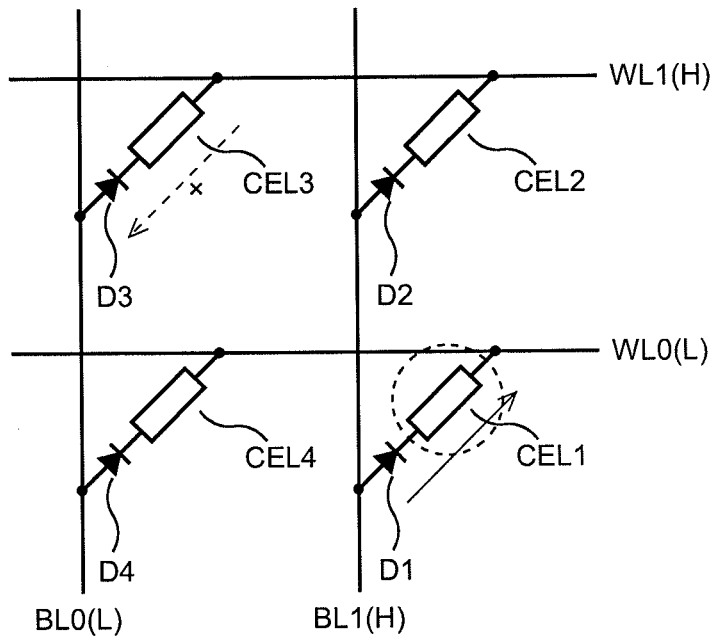
FIG. 17 is a circuit diagram showing a structure of a conventional semiconductor memory device.
Figure 18:
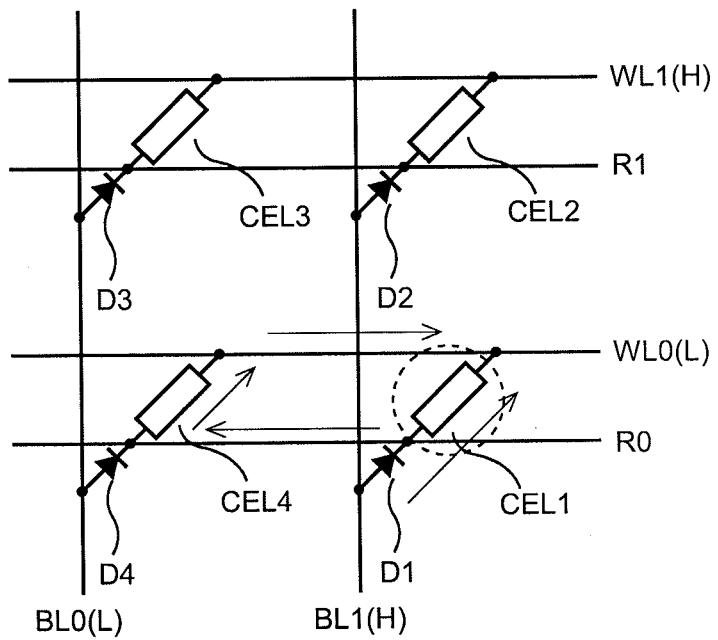
FIG. 18 is a circuit diagram showing a structure of a conventional semiconductor memory device.

According to the structure of the switching layer 14 described above, the inventors have confirmed that the reverse current in a portion encircled by a dashed line in FIG. 4 can be made as small as a reverse leakage current of a diode. This is because the switching layer 14 has a function of the diode. Therefore, the circuit of this embodiment is equivalent to the circuit as shown in FIG. 17, which incorporates the diodes. And applying a certain level of large negative voltage to the switching layer 14 is sufficient to turn the switching layer 14 from the ON state to the OFF state, and feeding a large reverse current is not necessary.

Therefore, the sneak current can be prevented without providing the diodes and the reset electrodes in addition to the switching layers 14 as in the conventional art. And since there is no need to provide the diodes and the reset electrodes in addition, the occupied area of the memory cells can be made very small, thus a highly integrated switching resistance RAM can be realized as a result.

Figure 5:
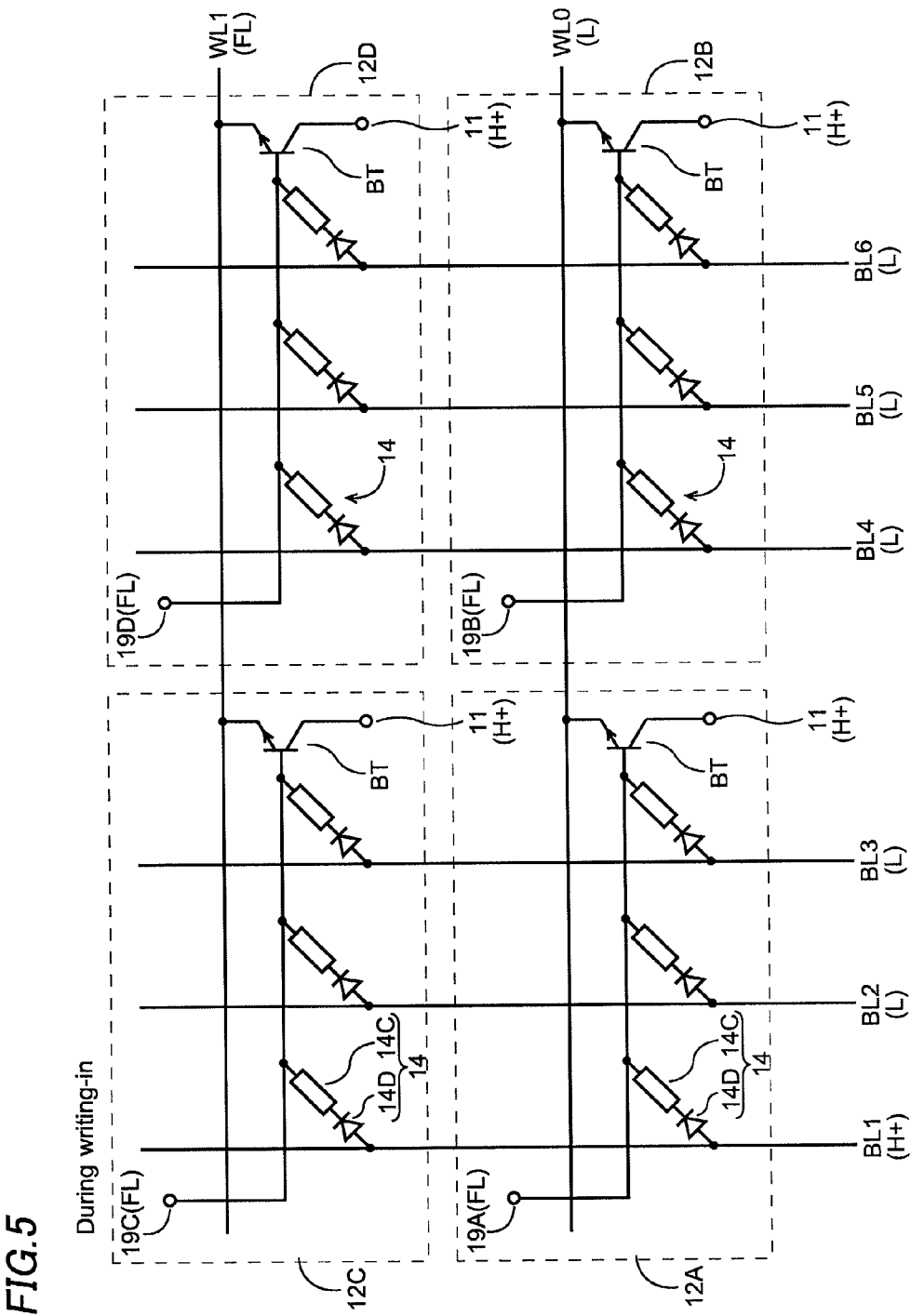
FIG. 5 is an equivalent circuit diagram of the semiconductor memory device according to the embodiment of this invention.
Figure 6:
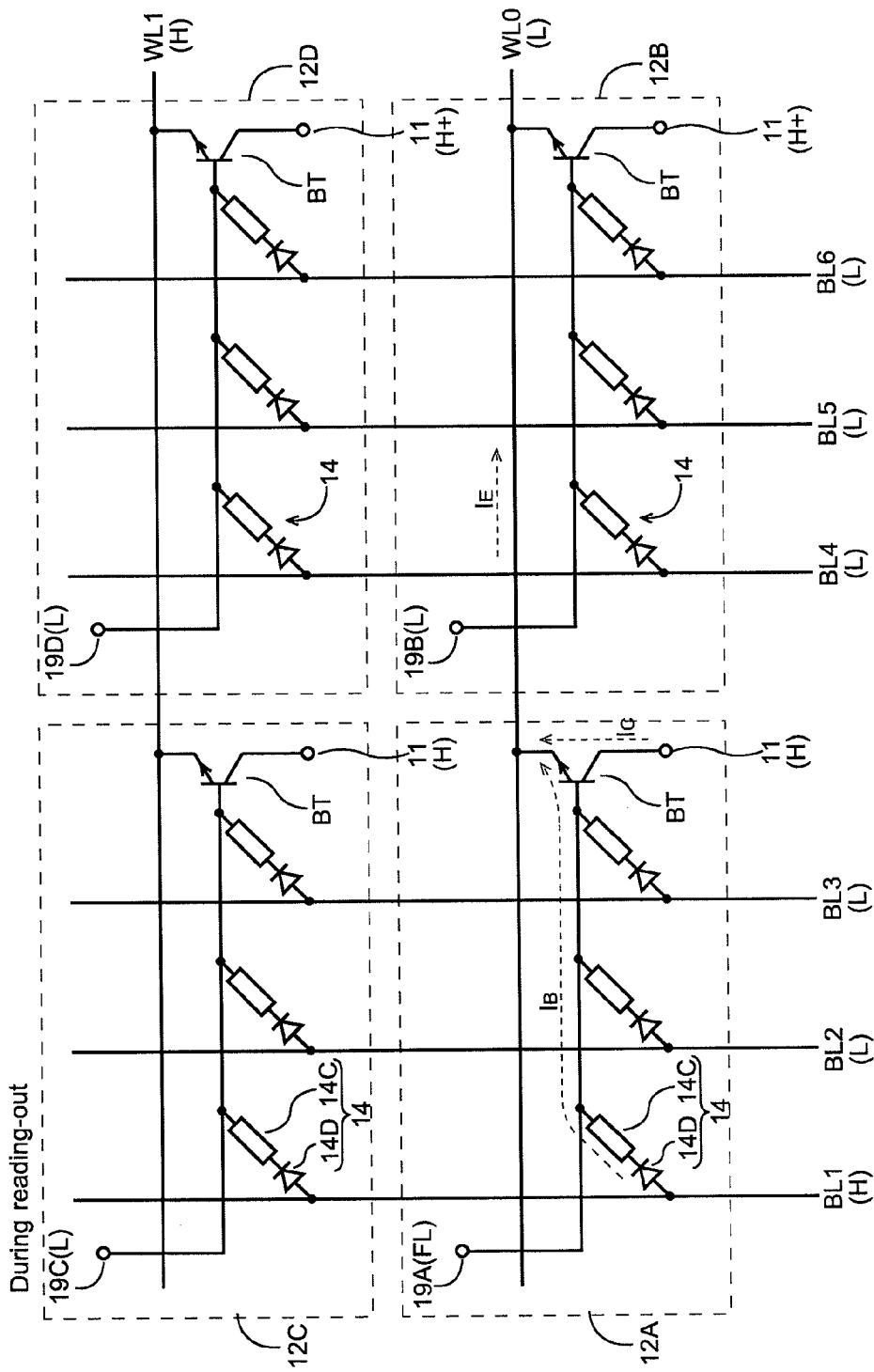
FIG. 6 is an equivalent circuit diagram of the semiconductor memory device according to the embodiment of this invention.
Figure 7:
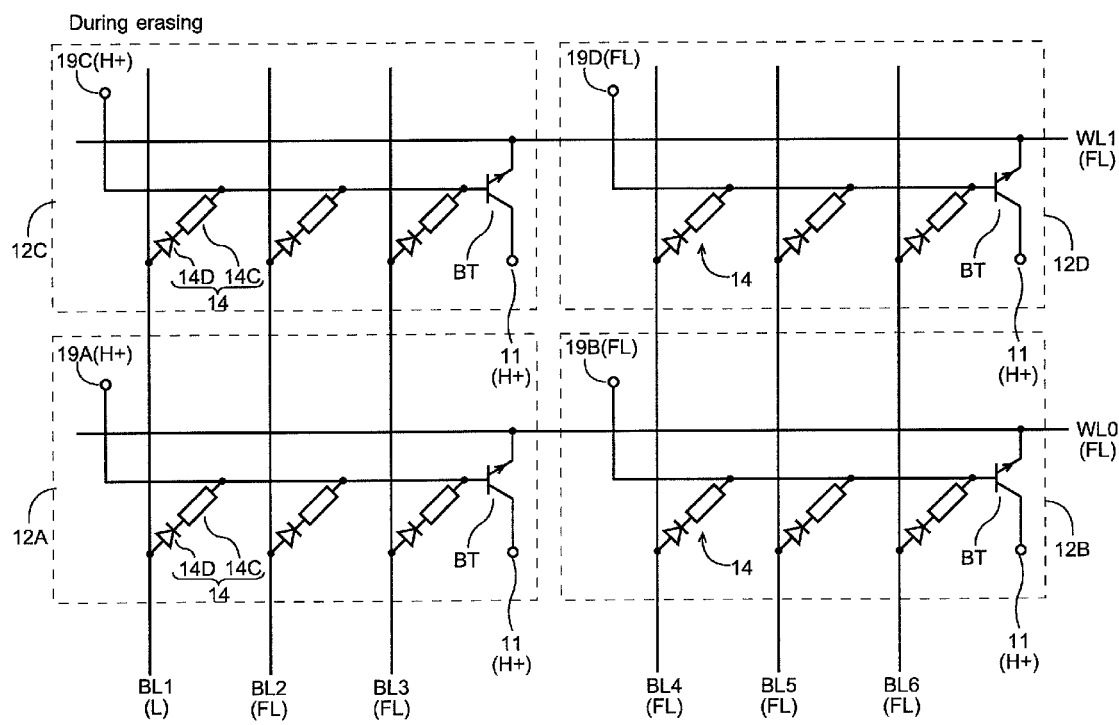
FIG. 7 is an equivalent circuit diagram of the semiconductor memory device according to the embodiment of this invention.

Detailed operations of the semiconductor memory device according to the embodiment are explained hereafter. FIG. 5, FIG. 6 and FIG. 7 show equivalent circuits of the semiconductor memory device shown in FIG. 1 and FIG. 2. And states of the electric potentials of the bit lines, word lines and the like during writing-in, reading-out and erasing are shown in Table 1.

In FIG. 5-FIG. 7, the switching layer 14 can be represented by a resistor 14C that has a resistance value varying between one in the ON state and the other in the OFF state and a diode 14D connected in series with the resistor 14C. Also shown in FIG. 5-FIG. 7 are four memory units that correspond to the P+ type Si layers 12A, 12B, 12C and 12D. Although the bit lines BL5 and BL6 and the bipolar transistors BT are omitted in FIG. 1 and FIG. 2, they are shown in FIG. 5-FIG. 7.

And in Table 1, "H" is the positive electric potential not high enough to cause the transition from the OFF state to the ON state, and "H+" is a positive electric potential high enough to cause the transition from the OFF state to the ON state and is a higher electric potential than "H". And "H+" applied to the electric potential fixing lines 19A-19D is a positive electric potential high enough to turn the switching layer 14 from the ON state to the OFF state. And "H" is a positive electric potential applied to the N-well 11 during reading-out. "H+" is the positive electric potential higher than it. "FL" represents being in a floating state. "L" is an electric potential lower than "H" and "H+", and is usually a ground electric potential.

TABLE 1

| Operation mode | Writing-in | Reading-out | Erasing |
|---|---|---|---|
| Selected bit line BL | H+ | H | L |
| Unselected bit line BL | L | L | FL |
| Selected word line WL | L | L | FL |
| Unselected word line WL | FL | H | FL |
| Electric potential fixing line (same P+ type layer) | FL | FL | H+ |
| Electric potential fixing line (different P+ type layer) | FL | L | H+ |
| N-well 11 | H+ | H | H+ |

[Operations During Writing-In]

Now, when the bit line BL1 and the word line WL0 are selected, the switching layer 14 at the intersection of the bit line BL1 and the word line WL0 becomes a selected cell. In this case, an electric potential of the bit line BL1 is set to "H+", and an electric potential of the word line WL0 is set to "L". Then, the forward voltage is applied to the selected switching layer 14 and the switching layer 14 is turned from the OFF state to the ON state. Note that an initial state of the switching layer 14 is assumed to be the OFF state.

At that time, no voltage is applied to the switching layers 14 that correspond to the unselected bit lines BL2-BL6 and the selected word line WL0, and their ON/OFF states are not varied.

And regarding the switching layer 14 that corresponds to the selected bit line BL1 and the unselected word line WL1, since the unselected word line WL1 is in the "FL" state, no voltage is applied to the switching layer 14 and its ON/OFF state is not varied. Further, regarding the switching layers 14 that correspond to the unselected bit lines BL2-BL6 and the unselected word line WL1, since the electric potential of the unselected bit lines BL2-BL6 is "L" and the electric potential of the unselected word line WL1 is "FL", their ON/OFF states are not varied either.

[Operations During Reading-Out]

Now, when the bit line BL1 and the word line WL0 are selected, the switching layer 14 at the intersection of the bit line BL1 and the word line WL0 becomes the selected cell. In this case, an electric potential of the bit line BL1 is set to "H" and an electric potential of the word line WL0 is set to "L". It is assumed that the switching layer 14 in the selected cell has been turned to the ON state by the writing-in operation described above. Then, the read-out current (base current $I_B$) flows from the switching layer 14 to the P+ type Si layer 12A (base layer), and this read-out current flows into the N+ type Si layer 15 (emitter layer). Then, the NPN type bipolar transistor BT is turned on. And the read-out current is amplified by the bipolar transistor BT, and the amplified read-out current flows to the word line WL0. At that time, an emitter current $I_E=I_B+I_c$ flows through the word line WL0. $I_c$ is a collector current.

At that time, regarding the unselected cells in the same P+ type Si layer 12A as the selected cell, that is, the switching layers 14 corresponding to the unselected bit lines BL2 and BL3 and the word line WL0, although a reverse electric potential is applied to the switching layers 14 by that the read-out current flows from the selected cell to the P+ type Si layer 12A to raise the electric potential of the P+ type Si layer 12A, their ON/OFF states are not varied since the electric potential is small.

And regarding the unselected cells that correspond to the unselected bit lines and the selected word line WL0 and are in the P+ type Si layer 12B different from the selected cell, that is, the switching layers 14 that correspond to the unselected bit lines BL4-BL6 and the word line WL0, no electric potential is applied and no read-out current flows since the electric potentials of the bit lines BL4-BL6 are set to "L" and the electric potential of the electric potential fixing line 19B is set to "L". And no current flows through the bipolar transistor BT either.

And regarding the switching layer 14 that corresponds to the selected bit line BL1 and the unselected word line WL1 (it is in the P+ type Si layer 12C), although the electric potential of the bit line BL1 is "H" and the electric potential of the P+ type Si layer 12C is "H" when the switching layer 14 is in the ON state and "L" when it is in the OFF state, no current flows through the bipolar transistor BT since the electric potential of the word line WL1 is "H".

And regarding the other unselected cells in the P+ type Si layer 12C, that is, the switching layers 14 that correspond to the bit lines BL2 and BL3 and the word line WL1, although the electric potential of the P+ type Si layer 12C is "H" when the switching layer 14 that corresponds to the selected bit line BL1 and the unselected word line WL1 is in the ON state, no current flows through the bipolar transistor BT since the electric potential of the word line WL1 is "H".

Further, regarding the other unselected cells in the P+ type Si layer 12D, that is, the switching layers 14 that correspond to the bit lines BL4, BL5 and BL6 and the word line WL1, no current flows through the bipolar transistor BT since the electric potentials of BL4, BL5 and BL6 are "L" and the electric potential of the unselected word line WL1 is "H".

[Operations During Erasing]

Now, suppose the bit line BL1 is selected. The electric potential of the bit line BL1 is set to "L", and the electric potentials of the electric potential fixing lines 19A and 19C are set to "H+". Thus, the reverse electric potential is applied to the switching layers 14 connected to the bit line BL1. As a result, information in all the cells (switching layers 14) connected to the bit line BL1 is erased all together. That is, the switching layers 14 are turned from the ON state to the OFF state.

On the other hand, the ON/OFF states of the unselected cells connected to the unselected bit lines are not varied since they are set to the "FL" state. Similarly, all the cells connected to the bit lines BL1 and BL2 can be erased by setting the electric potentials of the bit lines BL1 and BL2 to "L" and setting the electric potentials of the electric potential fixing lines 19A and 19C to "H+".

Various characteristics, the manufacturing method and a preferable structure of the memory cell using the switching layer 14 are hereafter explained in detail. In the following explanations, "Si" corresponds to the P+ type Si layers 12A-12D, "SiC" corresponds to the SiC layer 14A, and "Si oxide" corresponds to the Si oxide layer 14B. And "stacked layers of SiC and Si oxide" correspond to the switching layer 14.

Figure 8A:
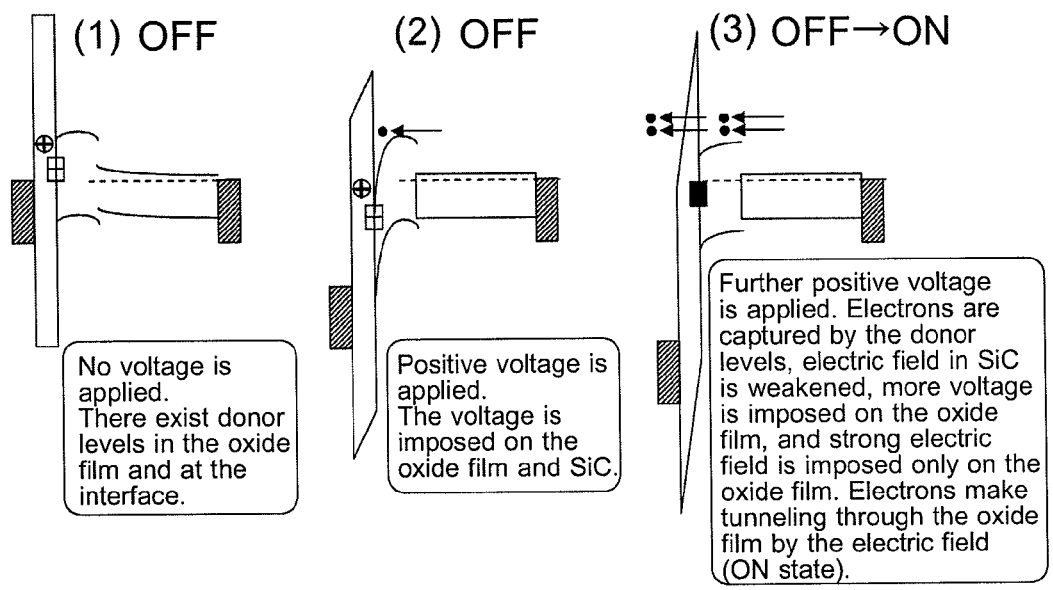
FIGS. 8A and 8B show memory operations of the semiconductor memory device according to the embodiment of this invention.
Figure 8A:
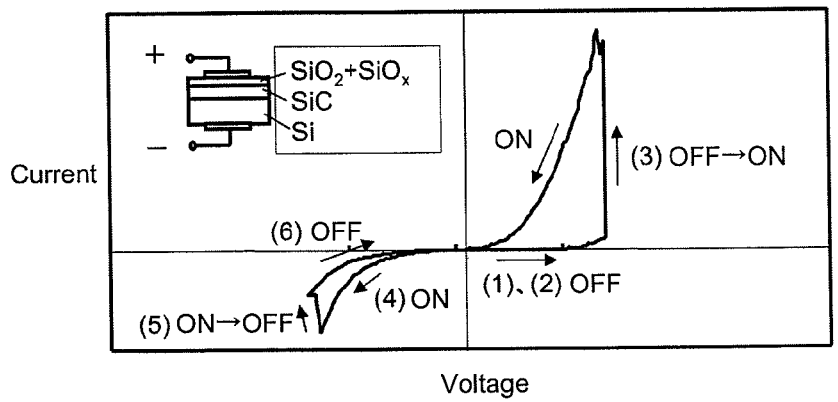
Figure 8B:
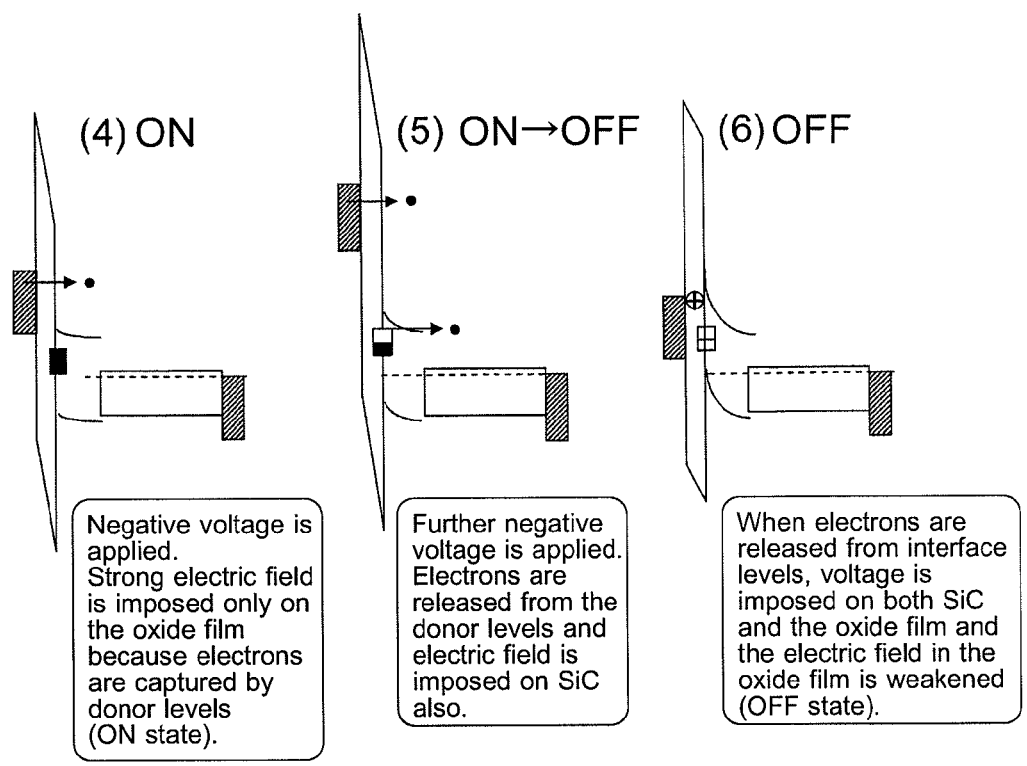

FIG. 8 shows memory operation models using band diagrams. When oxidation temperature is as low as 1000° C., the Si oxide is a mixture of $SiO_2$ that is a complete oxide and SiOx (x<2) that is an incomplete oxide. Also, since the oxide is formed through a process to remove C in the SiC, there exists, as a crystal defect, Si having dangling bonds, which are not bonded to other atoms, when the temperature is low, and there remains positively charged Si+ as the dangling bonds release electrons. Thus, there are such donor type defects in a region of the Si oxide and at an interface between the Si oxide and the SiC. A larger number of the donor type defects exist particularly at the interface between the Si oxide and the SiC (FIG. 8 (1)).

When a positive voltage is applied to a surface of the Si oxide, the applied voltage is primarily imposed on the Si oxide and the SiC because a resistance of the Si substrate is low. However, almost no current flows because the Si oxide makes a barrier. That is, the memory device as a whole is in the high resistance state. The high resistance state makes the OFF state (FIG. 8 (2)).

A band gap of Si is 1.1 eV, and a band gap of SiC is 2.3 eV in the case of a cubic crystal. When the voltage is further increased and exceeds a certain voltage, electrons are injected from the Si substrate to the SiC side since there is a band gap difference between the SiC and the Si substrate, and the electrons are captured by a multitude of donor type defects existing in large numbers at the interface between the Si oxide and the SiC. At that time, imposing a voltage becomes harder from the Si substrate to a region in which the electrons are captured, and more voltage is imposed on a region of the Si oxide in which small amount of electrons are captured. As a result, a strong electric field is caused in the Si oxide to induce tunneling of electrons and to make a current flow. Thus, the resistance of the memory device as a whole is reduced effectively. The low resistance state makes the ON state (FIG. 8 (3)). Turning from the OFF state to the ON state corresponds to writing-in of the information "1".

When a negative voltage is applied to the surface of the Si oxide while the memory device is in the ON state, the voltage is primarily imposed on the Si oxide and the tunneling of electrons continues to make the current flow because the electrons remain captured by the donor type defects Si+(FIG. 8 (4)). However, when further negative voltage is applied to the surface of the Si oxide, the captured electrons are released to make Si+ and the electrons are turned back to the Si substrate side. As a result, the voltage is imposed on both the Si oxide and the SiC again (FIG. 8 (5)). Eventually the electric field in the Si oxide is weakened, electrons can no longer make tunneling, and almost no current flows. That is, the resistance of the memory device as a whole is effectively increased and it turns to the OFF state (FIG. 8 (6)). Turning from the ON state to the OFF state corresponds to erasing or writing-in of the information "0".

That is, the memory operations use the donor type defects formed in the Si oxide. It turns to the ON state when the electrons are captured by the donor type defects Si+caused in the Si oxide and at the interface between the Si oxide and the SiC, and turns to the OFF state when the electrons are released from the donor type defects. Therefore, it can be regarded as memory operation that the ON state corresponds to storing a logical value "1" and the OFF state corresponds to storing a logical value "0". The OFF state can be turned to the ON state by increasing the voltage applied to the Si oxide large enough to the positive side, and the ON state can be turned to the OFF state by increasing the voltage large enough to the negative side on the contrary. And whether the stored value of the device is "0" (OFF state) or "1" (ON state) can be read out by checking whether the current flows or not at the low voltage.

Note that a larger number of donor type defects can be formed by oxidizing SiC than by oxidizing Si directly. This is because removing C and forming Si oxide can be made more easily by oxidizing SiC. And the existence of the SiC causes the case in which the voltage is imposed on both the SiC and the Si oxide and the case in which it is imposed only on the Si oxide depending on whether the electrons are captured or not by the defects, and varies the easiness of the current flow, that is, the resistance of the memory device.

Figure 9:
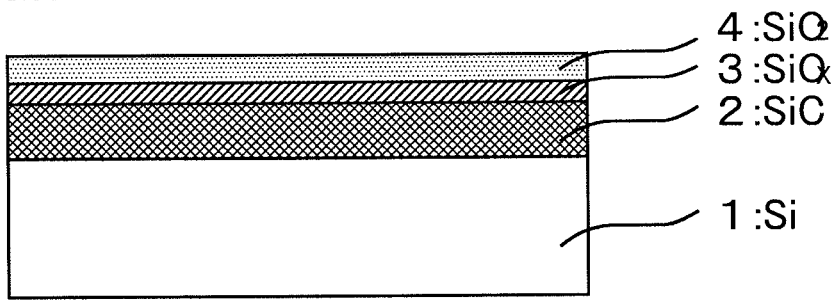
FIG. 9 shows a structure of the semiconductor memory device according to the embodiment of this invention.

FIG. 9 shows the structure of the semiconductor memory device. 1 denotes the Si substrate layer, 2 denotes the SiC layer, 3 denotes a second Si oxide layer and 4 denotes a first Si oxide layer. The Si substrate layer 1 uses a Si (111) substrate doped to N type. This is because the memory operations can be efficiently realized when the N type Si substrate having high electron density is used. And it is better that the SiC itself formed on the Si substrate layer 1 has high crystallinity with few defects, because an amount of the Si+defects is controlled in the Si oxide and at the interface between the Si oxide and the SiC. A film of the SiC of high crystallinity can be formed when a plane direction of the Si substrate is (111).

Figure 10:
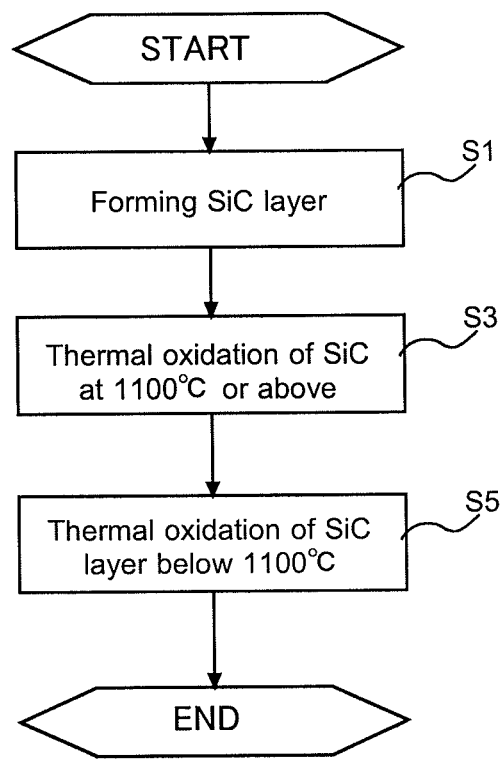
FIG. 10 is a flow chart showing a manufacturing method of the semiconductor memory device according to the embodiment of this invention.

The manufacturing method of the semiconductor memory device is explained hereafter using a flow chart shown in FIG. 10. The SiC layer 2 is formed by CVD method on the Si (111) substrate layer 1 doped to N type (step S1). The SiC layer 2 may be either doped or undoped. Or, the SiC layer 2 doped to P type may be formed on the Si substrate layer 1 that is doped to N type.

Next, oxygen is introduced into thermal oxidation apparatus to thermally oxidize the SiC in an oxidizing atmosphere at 1100° C. or above. Herewith the first Si oxide layer 4 is formed on the SiC layer 2 (step S3). A thickness of the first Si oxide layer 4 is preferably 2-20 nm.

Figure 11:
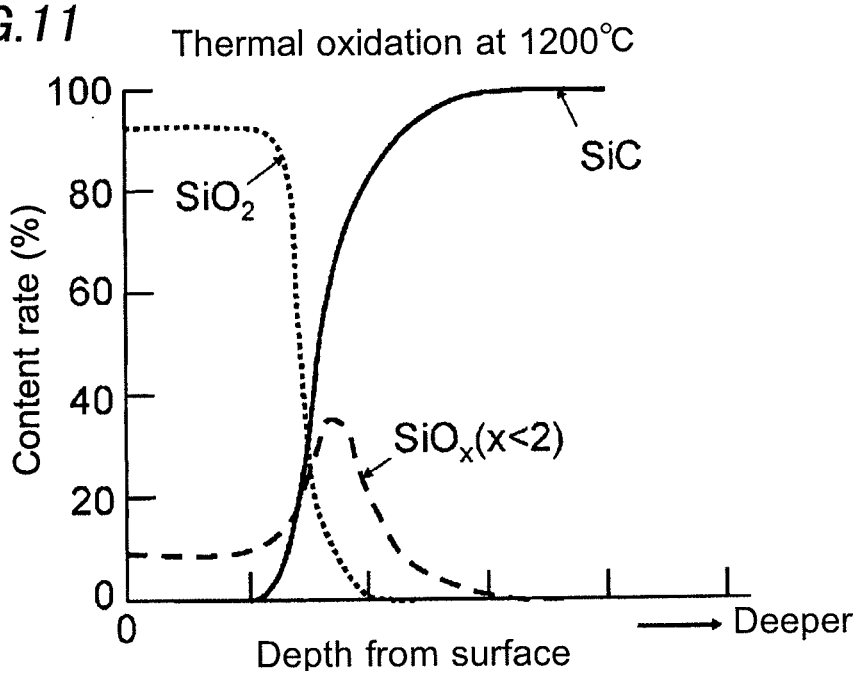
FIG. 11 shows $SiO_2$ and $SiOx$ content rates when SiC is thermally oxidized at 1200° C.

Since the first Si oxide layer 4 is formed by thermal oxidation of the SiC at high temperature, a $SiO_2$ content rate can be made 90% or above. FIG. 11 shows the Si oxide content rate in a direction of depth from the surface of the Si oxide when the SiC is thermally oxidized at 1200° C. As seen from FIG. 11, the content rate of $SiO_2$, that is a complete oxide, is about 90% from the surface of the Si oxide to a vicinity of the interface with the SiC. On the other hand, the content rate of SiOx, that is an incomplete oxide, is only about 10% on the surface of the Si oxide and only about 30% even in the vicinity of the interface with the SiC. Therefore, it is considered that the first Si oxide layer 4 is mostly made of $SiO_2$ that is a complete oxide.

Next, the oxidation temperature is reduced to below 1100° C., and the SiC is thermally oxidized. Herewith the second Si oxide layer 3 is formed between the SiC layer 2 and the first Si oxide layer 4 (step S5). A thickness of the second Si oxide layer 3 is preferably 10 nm or below.

Figure 12:
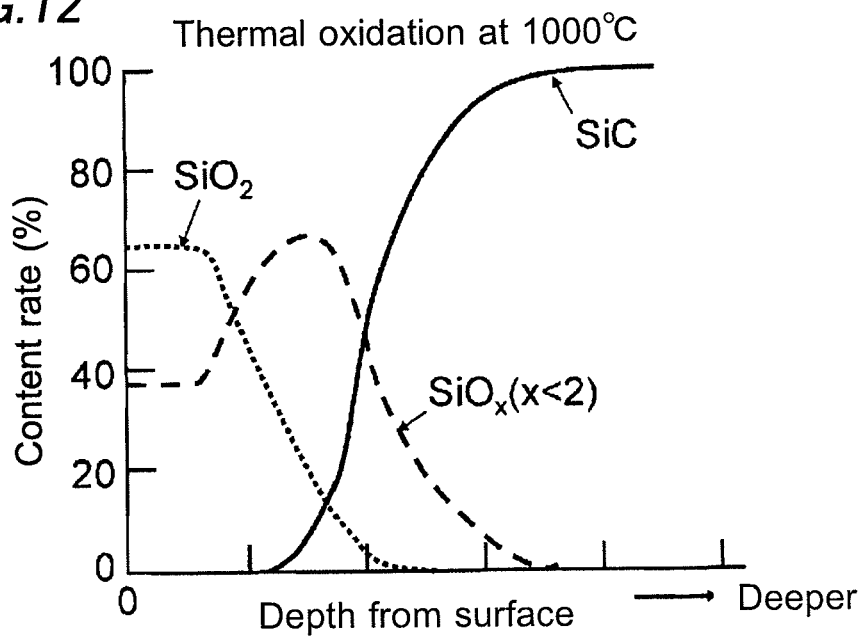
FIG. 12 shows $SiO_2$ and $SiOx$ content rates when SiC is thermally oxidized at 1000° C.

The content rate of the SiOx, which is an incomplete oxide, in the second Si oxide layer 3 is higher than in the first Si oxide layer 4, since the SiC is thermally oxidized at the temperature lower than the first Si oxide layer 4. FIG. 12 shows the Si oxide content rate in a direction of depth from the surface of the Si oxide when the SiC is thermally oxidized at 1000° C. As seen from FIG. 12, the content rate of $SiO_2$, that is the complete oxide, is about 65% at the surface of the Si oxide, which is lower than in the case where the thermal oxidation is made at 1200° C. On the other hand, the content rate of SiOx, that is the incomplete oxide, is as high as about 35% at the surface and about 65% in the vicinity of the interface with the SiC. Therefore, it is considered that the second Si oxide layer 3 is formed to be mixed with SiOx that is the incomplete oxide.

It is noted that a Si (100) substrate may be used as the Si substrate layer 1. Also, thermal treatment may be performed in an inert atmosphere such as in Ar as appropriate, after forming the SiC or after forming the Si oxide layer. Also, the first and second Si oxide layers may be formed using a mixed gas of $SiH_4$ and $N_2O$ and using a deposition method to deposit the Si oxide layer on the SiC by a chemical vapor deposition method (CVD method). The first Si oxide layer may be formed by the deposition method after the second Si oxide layer is formed by thermally oxidizing the SiC in an oxidizing atmosphere. Also, both the second and first Si oxide layers may be formed by the deposition method.

Figure 13:
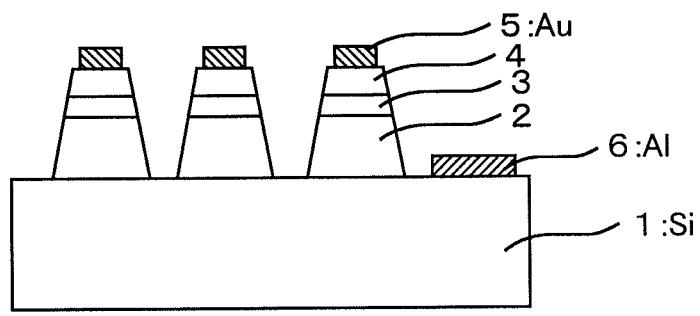
FIG. 13 shows a structure of a mesa type semiconductor memory device in the embodiment of this invention.

To integrate the memory device, the first Si oxide layer 4, the second Si oxide layer 3 and the SiC layer 2 are etched into a mesa type and electrodes 5 and 6 are formed on the first Si oxide layer 4 and on the Si substrate layer 1, respectively, as shown in FIG. 13. Au, Pt, Ni, Al or the like is used to form the electrodes 5 and 6. A multitude of the mesa type memory devices may be The manufacturing method is hereafter explained more concretely. The SiC layer 2 of a thickness of 400 angstroms was epitaxially formed by CVD method on the Si (100) substrate layer 1 that is doped to N type and of 0.1-0.5 Ωcm. Next, oxygen was introduced into thermal oxidation apparatus to form the first Si oxide layer 4 by oxidation in the oxidizing atmosphere at 1200° C. for three minutes. A thickness of the first Si oxide layer 4 was 12 nm.

Next, the oxidation temperature was lowered to 1000° C. and oxidation was carried out for five minutes to form the second Si oxide layer 3. A thickness of the second Si oxide layer 3 was 2 nm.

Next, the first Si oxide layer 4, the second Si oxide layer 3 and the SiC layer 2 were etched into the mesa type, and Au electrodes 5 were formed on the first Si oxide layers 4, and an Al electrode 6 was formed on the Si substrate layer 1. After that, three-dimensional wiring was formed above the mesa type to constitute an integrated type memory device. As a result of analysis by X-ray photoelectron spectroscopy, the first Si oxide layer 4 contained SiO$_2$ 95-100%, and the second Si oxide layer 3 contained SiO$_2$ 50-89%.

Figure 14:
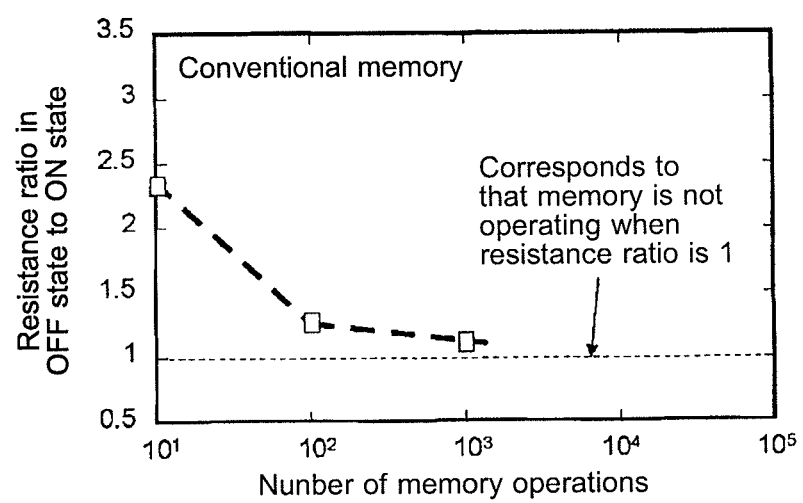
FIG. 14 shows results of measurements to measure dynamic characteristics of the number of memory operations of a semiconductor memory device in a conventional structure.
Figure 15:
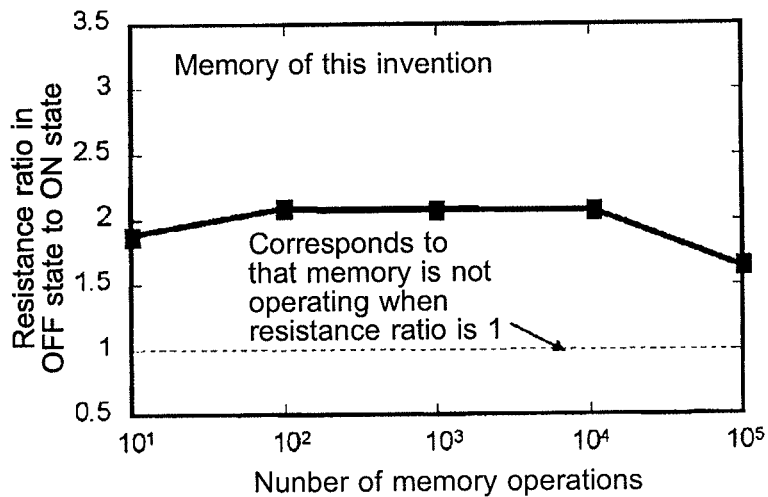
FIG. 15 shows results of measurements to measure dynamic characteristics of the number of memory operations of the semiconductor memory device in the embodiment of this invention.
Figure 16:
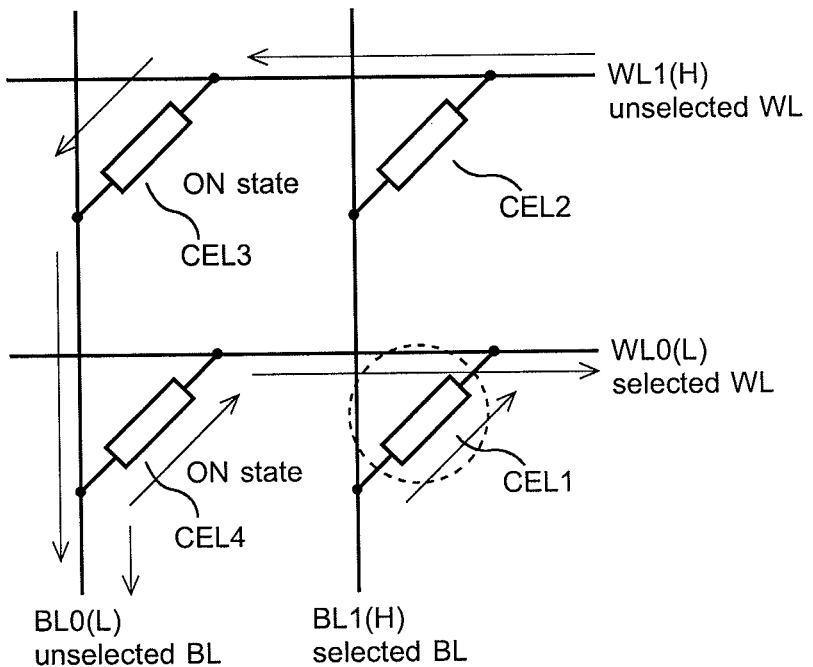
FIG. 16 is a circuit diagram showing a structure of a conventional semiconductor memory device.

FIG. 14 shows results of measurements to measure the number of memory operations of the semiconductor memory device according to the conventional structure. FIG. 15 shows results of measurements to measure the number of memory operations of the semiconductor memory device according to the embodiment described above. Note that vertical axes in FIG. 14 and FIG. 15 represent a ratio of the resistance of the memory in the OFF state to the resistance of the memory in the ON state, that is, how harder for the current to flow in the OFF state compared with in the ON state. When the resistance ratio is equal to 1, there is no difference between the current in the ON state and the current in the OFF state, which corresponds to that it is not operating as a memory.

In the embodiment, repetition characteristic is improved by more than 1000 times compared with the conventional case having only one Si oxide layer that is thermally oxidized at 1000° C. And while the resistance ratio approaches to 1 making the memory operation difficult when the number of memory operations exceeds 100 times in the conventional case, the resistance ratio is larger than 1.5 and is capable of making stable memory operations even when the number of operations exceeds 10$^5$ times in the case of the embodiment. And because the region of the defects that captures electrons can be restricted to a very narrow range of 2 nm that is the thickness of the second Si oxide layer 3, the captured electrons are released easily and the number of ON (corresponds to writing-in of the information "1")/OFF (corresponds to erasing or writing-in of the information "0") repetitions reached 10$^5$ times or above.

Note that similar effects can be obtained by adopting a double layer structure of the first Si oxide layer 4 and the second Si oxide layer 3 as the structure of the Si oxide layer 14B of the switching layer 14.

Note that this invention is not limited to the embodiment described above, and may be modified within the scope of the invention. For example, although the N-well 11 is formed on the P type Si substrate 10 and the island-shaped P+ type Si layers 12A-12D are formed in the surface of the N-well 11 in the embodiment, N type Si substrate may be used instead of the P type Si substrate 10 and the island-shaped P+ type Si layers 12A-12D may be formed in the surface of the N type Si substrate. Furthermore, conductivity types of the P type Si substrate 10, the N-well 11, the P+ type Si layers 12A-12D and the N+ type Si layer 15 in the embodiment may be changed into opposite conductivity types. In this case, the NPN type bipolar transistors BT become PNP type bipolar transistors.

And although three memory cells (switching layers 14) are disposed in each of the P+ type Si layers 12A-12D, how many memory cells are to be formed in each of the P+ type Si layers 12A-12D is determined by a relation between an amount of read-out current flowing through the switching layer 14 in the ON state and an amount of capacitance that each of the P+ type Si layers 12A-12D has (mainly a capacitance of a junction between itself and the N-well 11).

The invention claimed is:

1. A semiconductor memory device comprising:
a collector layer;
a base layer formed in a surface portion of the collector layer;
an emitter layer formed in a surface portion of the base layer;
a word line electrically connected to the emitter layer;
a plurality of bit lines extending over the base layer and intersecting the word line;
a plurality of switching layers each formed on a surface portion of the base layer, each of the switching layers being electrically connected to a corresponding bit line and configured to be switched from an ON state to an OFF state and from the OFF state to the ON state; and
an electric potential fixing line fixing the base layer at a predetermined electric potential,
wherein the switching layers are in direct contact with the surface portion of the base layer, and
the base layer comprises a silicon layer, and each of the switching layers comprises a SiC layer disposed on the silicon layer and a silicon oxide layer disposed on the SiC layer and electrically connected to the corresponding bit line.

2. The semiconductor memory device of claim 1, wherein the silicon oxide layer comprises a first silicon oxide layer disposed on the SiC layer and a second silicon oxide layer disposed on the first silicon oxide layer, and wherein a silicon oxide content of the second silicon oxide layer is greater than the silicon oxide content of the first silicon oxide layer.

3. The semiconductor memory device of claim 1, wherein the collector layer and the emitter layer are of a first conductivity type and the base layer is of a second conductivity type opposite from the first conductivity type.

* * * * *